(12) United States Patent
Sato

(10) Patent No.: US 6,785,312 B2
(45) Date of Patent: Aug. 31, 2004

(54) SEMICONDUCTOR LASER AND SYSTEM FOR AND METHOD OF PERFORMING DIGITAL OPTICAL COMMUNICATIONS USING SUCH SEMICONDUCTOR LASER

(75) Inventor: Kenji Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 245 days.

(21) Appl. No.: 09/928,663

(22) Filed: Aug. 14, 2001

(65) Prior Publication Data

US 2002/0024983 A1 Feb. 28, 2002

(30) Foreign Application Priority Data

Aug. 16, 2000 (JP) ........................................ 2000-246829

(51) Int. Cl.$^7$ .............................. H01S 5/00; H01S 3/08
(52) U.S. Cl. ..................................... 372/45; 372/96
(58) Field of Search ............................ 372/43–50, 96

(56) References Cited

U.S. PATENT DOCUMENTS

| | | | |
|---|---|---|---|
| 4,794,618 A | * 12/1988 | Mito | ........................... 372/96 |
| 5,012,484 A | * 4/1991 | Flynn et al. | .................... 372/96 |
| 5,321,716 A | * 6/1994 | Kinoshita et al. | .............. 372/96 |
| 5,347,526 A | * 9/1994 | Suzuki et al. | .................. 372/20 |
| 5,790,578 A | * 8/1998 | Takano | .......................... 372/45 |
| 5,793,787 A | * 8/1998 | Meyer et al. | ................... 372/45 |
| 6,141,363 A | * 10/2000 | Ougazzaden et al. | .......... 372/45 |
| 6,470,039 B1 | * 10/2002 | Ukita | ........................... 372/46 |

FOREIGN PATENT DOCUMENTS

| JP | 4-156120 | 5/1992 |
|---|---|---|
| JP | 7-106691 | 4/1995 |

* cited by examiner

Primary Examiner—Quyen Leung
(74) Attorney, Agent, or Firm—McGinn & Gibb, PLLC

(57) ABSTRACT

A digital optical communication method transmits an optical signal over a long distance with a reduced power penalty. The method has the step of shaping the waveform of the optical signal to be transmitted through the optical fiber to increase the frequency thereof before the waveform is stabilized when the optical signal starts increasing in level at the time the optical signal is applied to the optical fiber.

12 Claims, 12 Drawing Sheets

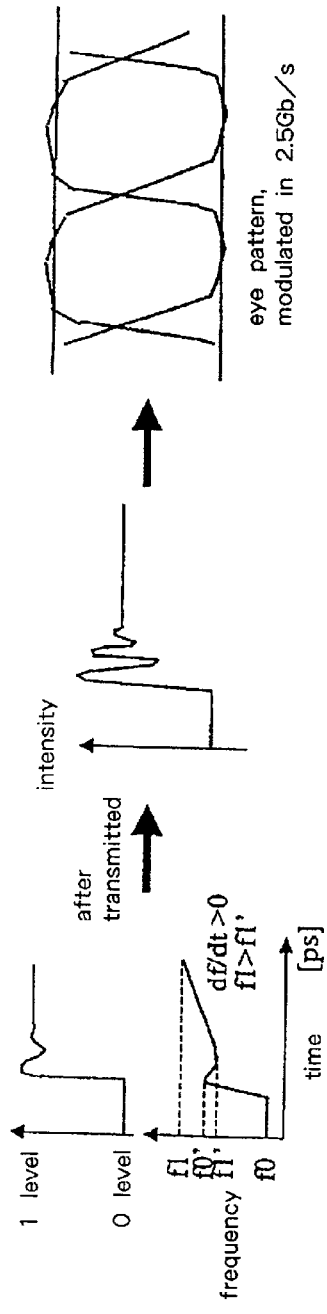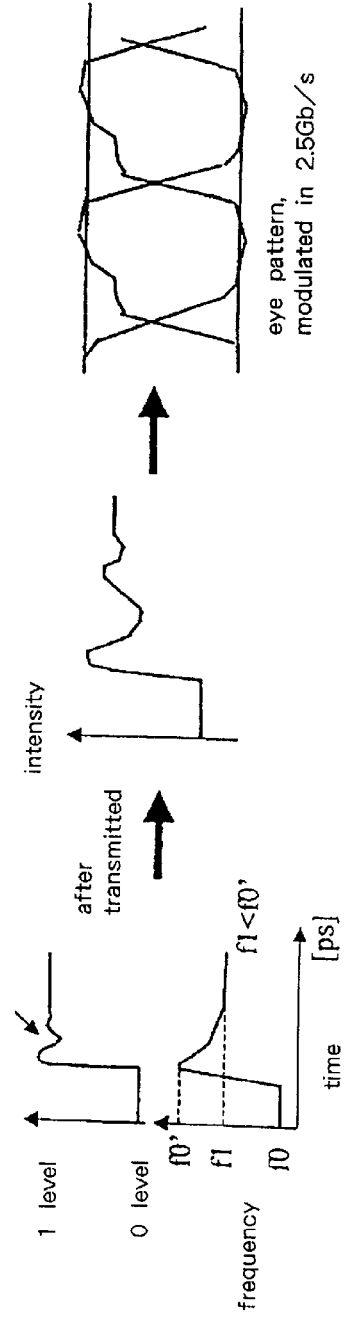

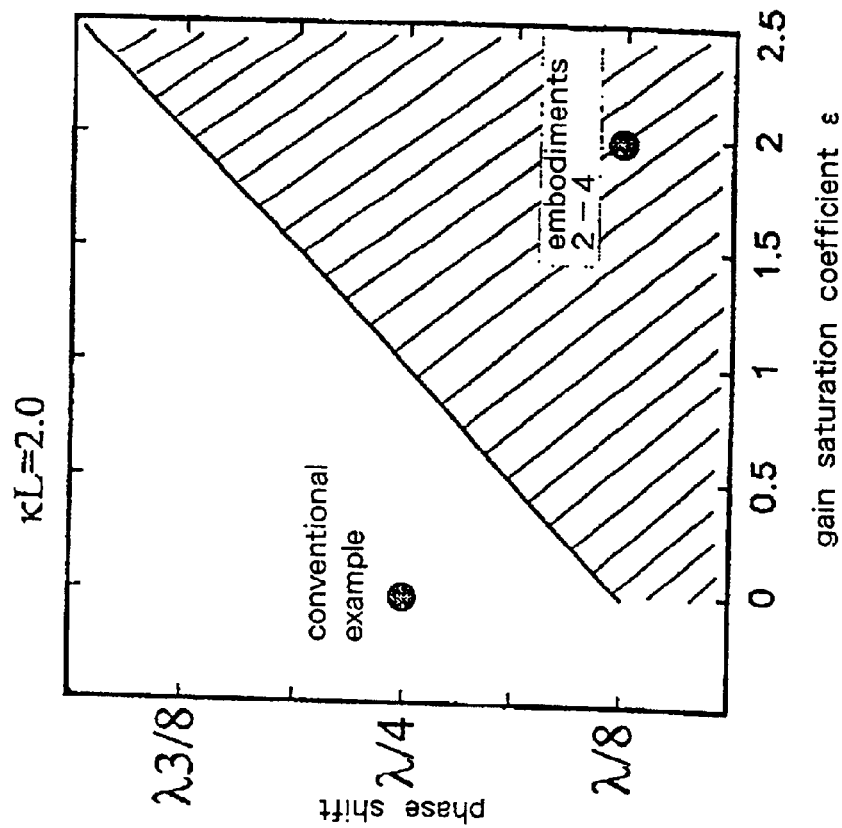
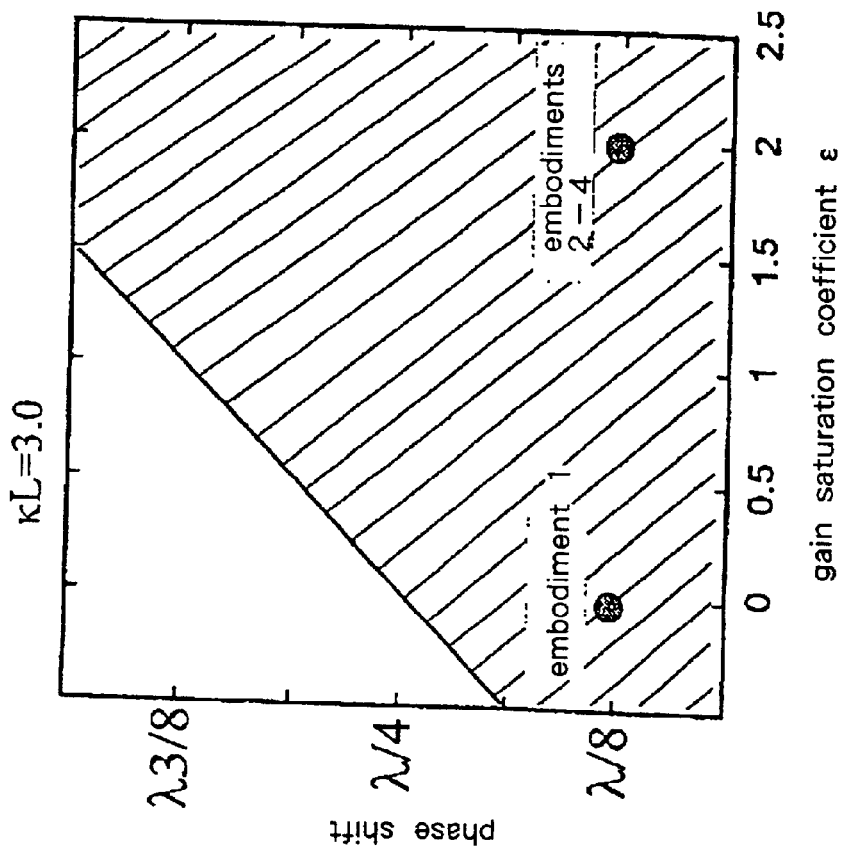

SEMICONDUCTOR LASER AND SYSTEM FOR AND METHOD OF PERFORMING DIGITAL OPTICAL COMMUNICATIONS USING SUCH SEMICONDUCTOR LASER

BACKGROUND OF THE INVENTION

1. Field of the Invention

The present invention relates to a semiconductor laser for use as a light source in a digital optical communication system, and a system for and method of performing digital optical communications using such a semiconductor laser.

2. Description of the Related Art

Conventional semiconductor laser devices for digital optical communications widely use a λ/4 phase-shifted distributed-feedback semiconductor laser. When an optical output signal that has directly been modulated by such a semiconductor laser device is transmitted through an optical fiber, the waveform of the optical output signal is spread by the dispersing effect of the optical fiber, lowering the bit error rate.

FIG. 1 of the accompanying drawings shows an arrangement of a communication system which employs a general optical fiber.

As shown in FIG. 1, electric signal ES1 representing information with 0s and 1s is applied to energize a semiconductor laser 1201 as an electro-optical transducer, which converts electric signal ES1 into optical digital signal OS that is transmitted through optical fiber 1202. Optical digital signal OS that is outputted from optical fiber 1202 is applied to receiver 1203, which converts optical digital signal OS into digital electric signal ES2.

Optical fibers that are most widely used in the 1.55 μm band in optical communication systems have a dispersing effect such that optical signals having higher frequencies travel through the optical fibers at higher rates and optical signals having lower frequencies travel through the optical fibers at lower rates. Direct-modulation semiconductor lasers for use as an electro-optical transducer have general characteristics such that the frequency of an optical signal produced thereby is lowered when the optical intensity thereof varies. Therefore, the optical signal that has been generated by the direct-modulation semiconductor laser and transmitted through the optical fiber has its waveform degraded.

Semiconductor lasers are roughly classified into two types, i.e., a semiconductor laser combined with an external modulator as disclosed in Japanese laid-open patent publication No. 07-106691 and a direct-modulation semiconductor laser as disclosed in Japanese laid-open patent publication No. 04-156120.

The former semiconductor laser that is combined with the external modulator is energized to produce an optical signal with a constant output level, which is modulated by the external modulator. Therefore, any frequency variation of the output optical signal is very small, and the output optical signal can be transmitted over a distance of several hundreds km. However, the overall assembly is complex and relatively costly.

The latter direct-modulation semiconductor laser suffers very large optical signal frequency variations as the optical signal intensity varies. It has been reported that after an optical signal produced by the direct-modulation semiconductor laser has been transmitted over a distance of 100 km, it suffers a high power penalty of several decibels. The power penalty represents a degradation of the reception sensitivity which is estimated as a substantial loss of the received power of the optical signal. Consequently, the direct-modulation semiconductor laser is not suitable for use as a light source for producing optical signals that are to be transmitted over long distances.

SUMMARY OF THE INVENTION

It is therefore an object of the present invention to provide a digital optical communication method for transmitting an optical signal over a distance of 100 km with a power penalty reduced to 1 decibel or less or a negative value, an inexpensive semiconductor laser suitable for use in such a digital optical communication method, and a digital optical communication system which employs such a semiconductor laser.

According to the present invention, there is provided a method of performing digital optical communications to transmit an optical signal through an optical fiber, comprising the step of shaping the waveform of the optical signal to be transmitted through the optical fiber to increase the frequency thereof before the waveform is stabilized when the optical signal starts increasing in level at the time the optical signal is applied to the optical fiber.

According to the present invention, there is also provided a semiconductor laser comprising a diffraction grating for effecting distribution feedback, the diffraction grating having a normalized coupling coefficient κL of at least 2.0, the diffraction grating having a phase shift region disposed therein for achieving a phase shift of at most λ/4, and an active layer having a gain which is saturated as a carrier concentration in the active layer increases.

The semiconductor laser may further comprise a resonator, the phase shift region being disposed nearly centrally in the resonator.

The active layer may have a multiple quantum well structure having growth surface irregularities.

The active layer may have a multiple quantum well structure composed of two stage potential quantum wells.

The active layer may have a multiple quantum well structure including a non-radiative carrier recombination layer.

The active layer may have a multiple quantum well structure which is progressively thicker toward the center of the semiconductor laser in the axial direction of the resonator.

According to the present invention, a digital optical communication system has the above semiconductor laser used as a communication light source.

The above and other objects, features, and advantages of the present invention will become apparent from the following description with reference to the accompanying drawings which illustrate examples of the present invention.

BRIEF DESCRIPTION OF THE DRAWINGS

FIG. 2(*a*) is a diagram showing the intensity and frequency of an optical signal produced by a semiconductor laser energized by an energizing process according to the present invention at the time the semiconductor laser starts to operate, and the intensity and eye pattern of the optical signal after it has been transmitted through an optical fiber;

FIG. 2(*b*) is a diagram showing the intensity and frequency of an optical signal produced by a semiconductor laser energized by a conventional energizing process as a comparative example, and the intensity and eye pattern of the optical signal after it has been transmitted through an optical fiber;

FIG. 6(a) and 6(b) are diagrams showing the relationship between phase shifts and gain saturation coefficients $\epsilon$ for producing the pulse compression effect according to the present invention, with normalized coupling coefficients $\kappa L$ set to 3.0 and 2.0, respectively;

DETAILED DESCRIPTION OF THE PREFERRED EMBODIMENTS

Figure 1:
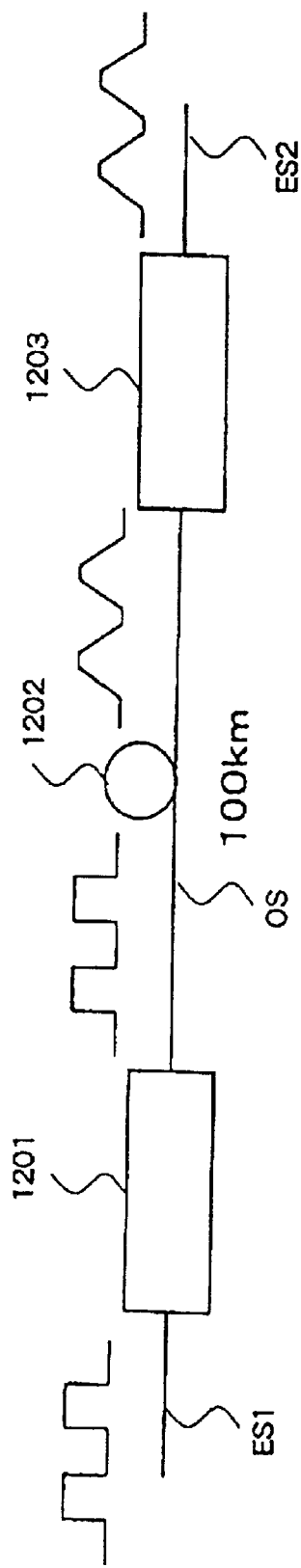
FIG. 1 is a view of a communication system using a general optical fiber.

Prior to describing preferred embodiments of the present invention, the principles of the present invention will be described below.

FIGS. 2(a) and 2(b) illustrate in detail frequency variations at the time a direct-modulation semiconductor laser is directly modulated.

FIG. 2(a) shows the intensity and frequency of an optical signal produced by a semiconductor laser energized by an energizing process according to the present invention at the time the semiconductor laser starts to operate, and the intensity and eye pattern of the optical signal after it has been transmitted through an optical fiber, and FIG. 2(b) shows the intensity and frequency of an optical signal produced by a semiconductor laser energized by a conventional energizing process as a comparative example, and the intensity and eye pattern of the optical signal after it has been transmitted through an optical fiber.

When a semiconductor laser is directly modulated, at the time an optical output signal generated there increases from a 0 level to a 1 level, there occurs a phenomenon called "relaxation oscillation" in which the level of the optical output signal oscillates. The frequency of the optical output signal also oscillates with the relaxation oscillation. As shown in FIG. 2(b), the frequency of the optical output signal does not oscillate as violently as the level of the optical output signal, oscillates in a relatively small interval, is shifted into a lower frequency range, and settles on a certain frequency.

Since the frequency of an optical output signal that varies due to relaxation oscillation is shifted into a lower frequency range, after the optical output signal has been transmitted through an optical fiber, the oscillation of the level of the optical output signal is spread over a time axis. As described above, the frequency of relaxation oscillation of the optical output signal is lowered after it has been transmitted through the optical fiber. When the optical output signal is converted into an electric signal by a receiver, the electric signal is shaped in waveform by a low-pass filter in the receiver. However, because the frequency of relaxation oscillation of the optical output signal has been lowered, the relaxation oscillation is not removed by the low-pass filter, but remains in the electric signal.

Since the direct-modulation semiconductor laser operates in the manner described above, the waveform of the optical output signal that has been transmitted through the optical fiber is degraded, increasing a bit error rate which represents a probability that the transmitted signal suffers an error when it is received. As a result, the power penalty is increased, resulting in a reduction of reception sensitivity by 2 through 5 decibels.

According to the present invention, frequency variations caused when the semiconductor laser is directly modulated are shifted in the direction opposite to the conventional direction to prevent the waveform of the optical output signal that has been transmitted through the optical fiber from being degraded. Specifically, at the time the optical output signal increases from a 0 level to a 1 level, the semiconductor laser is operated to shift the frequency variations progressively into a higher frequency range and also to cause the optical output signal to reach a stable level in a period of time which is several times longer than the conventional period of time, so that the principles of the present invention remain effective even when the semiconductor laser produces a succession of 1 levels. The waveform of the transmitted optical output signal is prevented from being degraded regardless of the number of successive 1 levels in a signal bit pattern that is used in actual digital optical communications.

According to the present invention, since the frequency variations are produced in the opposite direction to the conventional direction, such that the frequency of oscillations of the optical output signal intensity due to relaxation oscillation becomes higher after the optical output signal has been transmitted through the optical fiber. After the optical output signal has been converted into an electric signal and the electric signal has passed through the low-pass filter, the relaxation oscillation is removed, restoring the original waveform of the optical output signal. As a result, the power penalty is made smaller than the conventional power penalty, and decreases to 1 decibel or lower. Giving such a dispersion as to increase the frequency of oscillations of the optical output signal intensity due to relaxation oscillation during transmission of the optical output signal is referred to as "pulse compression effect".

A phase shift DFB laser disclosed in Japanese laid-open patent publication No. 2000-077774 and having such structural details and characteristics as described below is used as a basis for a semiconductor laser according to the present invention.

The phase shift DFB laser includes a resonator having a diffraction grating structure that is divided into a plurality of regions in the longitudinal direction of the resonator with phase shifters disposed between the regions. A total phase shift caused by the phase shifters is represented by a quantity corresponding to $\lambda/n$ (where $\lambda$ is the wavelength of oscillations and n>4).

When the optical output signal from the semiconductor laser varies, the detuned quantity of the semiconductor laser varies in opposite phase to the variations of the optical output signal level, and the reflecting mirror loss that determines an oscillation mode also varies with the detuned quantity, and the emission intensity of the semiconductor laser also varies.

When the reflecting mirror loss increases, the optical output signal from the semiconductor laser decreases. Conversely, when the reflecting mirror loss decreases, the optical output signal level from the semiconductor laser increases. Therefore, depending on the direction in which the reflecting mirror loss varies as the detuned quantity of the semiconductor laser varies, variations of the optical output signal level due to reflected returning light may be increased or reduced.

It is known that the direction in which the reflecting mirror loss varies as the detuned quantity of the semiconductor laser varies depends on a phase shift provided by the diffraction grating structure of the DFB laser. Specifically, if the phase shift is greater than a quantity corresponding to $\lambda/4$ (where $\lambda$ is the wavelength of oscillations), then the reflecting mirror loss decreases (increases) as the detuned quantity decreases (increases). Therefore, if the optical output signal from the semiconductor laser increases owing to the reflected returning light, then the detuned quantity decreases and the reflecting mirror loss decreases. As a result, the optical output signal from the semiconductor laser increases additionally, i.e., the variations of the optical output signal due to the reflected returning light are amplified. Consequently, if the phase shift is greater than $\lambda/4$, then a positive feedback phenomenon occurs.

Conversely, if the phase shift is smaller than a quantity corresponding to $\lambda/4$, then the reflecting mirror loss increases (decreases) as the detuned quantity decreases (increases). Therefore, if the optical output signal from the semiconductor laser increases owing to the reflected returning light, then the detuned quantity decreases and the reflecting mirror loss increases. As a result, the optical output signal from the semiconductor laser varies in a decreasing direction, i.e., an increase in the optical output signal due to the reflected returning light is suppressed. Consequently, if the phase shift is smaller than $\lambda/4$, then a negative feedback phenomenon occurs.

As a consequence, if the phase shift is smaller than a quantity corresponding to $\lambda/4$, then it is possible to suppress variations of the optical output signal from the DFB laser due to the reflected returning light, i.e., it is possible to increase the resistance of the DFB laser against the reflected returning light.

1st Feature of the Invention

It is assumed in FIGS. 2(a) and 2(b) that the frequency at the 0 level is represented by f0, the frequency at a first carrier charge by f0', and the frequency @ the level 1 by f1. According to the first feature of the present invention, after the time the frequency f0' is reached and before the frequency is stabilized at f1, the frequency progressively toward f1 with time, the time required for the frequency to be stabilized at f1 is made longer than the conventional time.

One condition for the phase shift DFB laser having the properties described above to increase the frequency progressively toward f1 with time is that a normalized coupling coefficient $\kappa L$ is greater than the conventional value. With the phase shift DFB laser, in general, an internal electric field intensity becomes irregular because of a phenomenon called longitudinal spatial hole burning, and the optical frequency varies depending on the bias electric field in a static state.

As the normalized coupling coefficient $\kappa L$ is greater, the optical frequency varies to a greater extent depending on the bias electric field. In order to stabilize the optical frequency, it heretofore has been considered that an optimum range for the normalized coupling coefficient $\kappa L$ is 1.5 to 2.0 to prevent the optical frequency from differing depending on the bias electric field. This is because it has heretofore been considered that if the normalized coupling coefficient $\kappa L$ were greater than 2.0, it would adversely affect the static characteristics of the laser.

According to the present invention, however, an optimum range for the normalized coupling coefficient $\kappa L$ is 2.0 to 3.5. When a step signal is applied to the phase shift DFB laser, the carrier concentration initially increases (f0'), and thereafter the carrier concentration decreases as the optical output signal level increases, and the refractive index increases, shifting the wavelength into a longer wavelength range (the frequency f1 in FIG. 2(b)). If the normalized coupling coefficient $\kappa L$ is large and a gain saturation coefficient $\epsilon$ (described later on) is large, then since the effect of the longitudinal spatial hole burning increases, the reflecting mirror loss increases. In order to achieve the same optical signal output level, the carrier concentration at the stable level after the step response increases, and the wavelength is shifted into a shorter wavelength range than usual. If the amount by which the wavelength is shifted into the shorter wavelength range is larger than the amount by which the wavelength is shifted into the longer wavelength range, then the frequency progressively increases toward f1 with time, resulting in the compression of the pulse.

According to the present invention, the normalized coupling coefficient $\kappa L$ larger than usual is used in order to improve the transmission characteristics. Generally, however, if the normalized coupling coefficient $\kappa L$ is large, then the linearity of the current vs. optical output characteristics of the semiconductor laser is impaired. In view of this, according to the present invention, the maximum value for the normalized coupling coefficient is set to 3.5 which is a limit value that the semiconductor laser can withstand in the communications fields.

The normalized coupling coefficient $\kappa L$ can be increased generally by increasing the amplitude of the diffraction grating and increasing the difference between refractive indexes of semiconductors on both sides held in contact with the diffraction grating.

2nd Feature of the Invention

Figure 4:
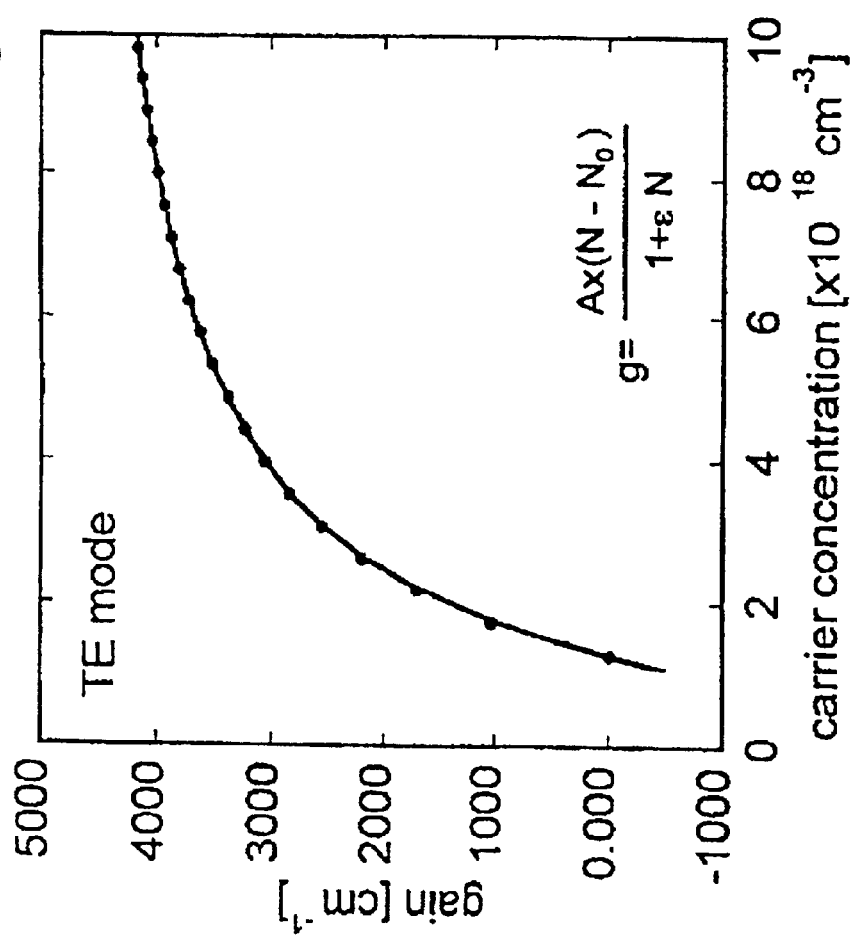
FIG. 4 is a diagram showing gain vs. carrier characteristics of a structure in which the optical gain of an active layer is saturated as the carrier intensity increases.

According to the present invention, in order to increase the time in which to stabilize the frequency at f1, the semiconductor laser is of such a structure that the optical gain of the active layer is saturated as the carrier concentration increases. For example, if the optical gain is indicated by the following equation (1):

$$g = A(N-N_0)/(1+\epsilon N) \quad (1)$$

then the gain vs. carrier characteristics are represented by a curve shown in FIG. 4. In the above equation, A represents a differential gain, N an active layer carrier concentration, and $N_0$ a carrier concentration at which the active layer is transparent.

The characteristic curve shown in FIG. 4 indicates that when the carrier concentration increases, the rate of increase of the optical gain, i.e., the differential gain thereof, decreases. Therefore, when the semiconductor laser is biased to the 1 level, as the frequency is progressively varied to a stable value, the carrier concentration of the active layer increases, and the differential gain decreases. Since the frequency of relaxation oscillations of the semiconductor laser is proportional to the square root of the differential gain, it can be understood that if there is an effect of dynamically reducing the differential gain as described above, then the time required for the optical frequency to become stabilized at the frequency f1 is increased. Heretofore, the above effect is essentially unavailable because the gain saturation coefficient $\epsilon$ is set to substantially 0.

3rd Feature of the Invention

In order to further augment the effect of shifting the frequency into a higher frequency range to improve the transmission characteristics, it is effective to reduce the phase shift of the phase-shifted DFB laser to a value smaller than the conventional value of $\lambda/4$. The phase shift is an excessive phase shift that is applied from the diffraction grating to the light at a certain position on the axis of the resonator. As the phase shift is smaller, the reflecting mirror loss increases. Therefore, the amount by which the wavelength is shifted into a shorter wavelength range is further increased.

As described in Japanese laid-open patent publication No. 2000-077774, if the phase shift is small, then variations of the optical output signal level due to the relaxation oscillation is reduced, and hence the frequency variations are also reduced. If the above structure is applied to the present invention, then since the amplitude of oscillations of the optical output signal level due to the relaxation oscillation is reduced, the waveform of the optical output signal after it has been transmitted through the optical fiber is free of degradations. Therefore, the effect of the present invention is further increased, resulting in a greater reduction in the power penalty on the optical output signal after it has been transmitted through the optical fiber.

As well known in the art, the differential gain is increased by setting the diffraction grating period to cause laser oscillation at a shorter wavelength than the gain peak wavelength of the active layer. This diffraction grating period setting should be incorporated into the arrangement of the present invention to make it more effective.

FIGS. 6(a) and 6(b) show the relationship between phase shifts and gain saturation coefficients $\epsilon$ for producing the pulse compression effect according to the present invention, with normalized coupling coefficients $\kappa L$ set to 3.0 and 2.0, respectively.

The pulse compression effect according to the present invention appears in hatched ranges shown in FIGS. 6(a) and 6(b). The above equation (1) is given by way of example only, and the present invention is not limited to the equation (1) insofar as the rate of increase of the optical gain increases as the carrier concentration N increases. According to embodiments of the present invention to be described later on, there are provided quantum well active layer structures for intentionally achieving the above pulse compression effect.

Figure 5:
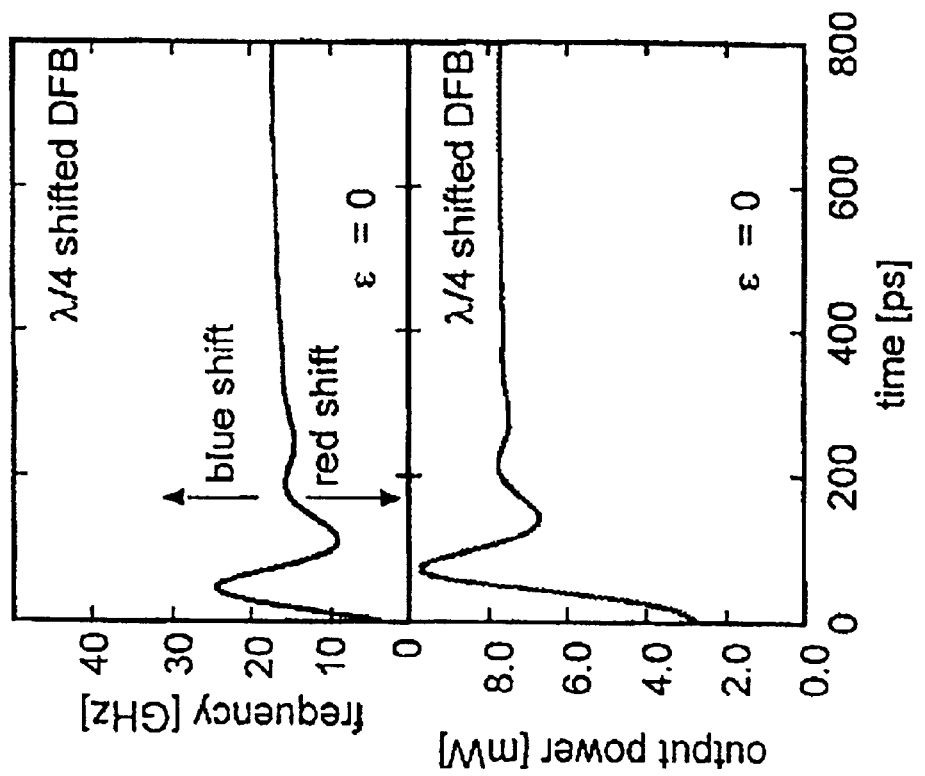
FIG. 5(a) is a diagram showing the frequency variations and optical intensity of an optical signal produced by the semiconductor laser, which are calculated under the condition for producing a pulse compression effect according to the present invention.
FIG. 5(b) is a diagram showing the frequency variations and optical intensity of an optical signal produced by a conventional semiconductor laser as a comparative example.
Figure 5:
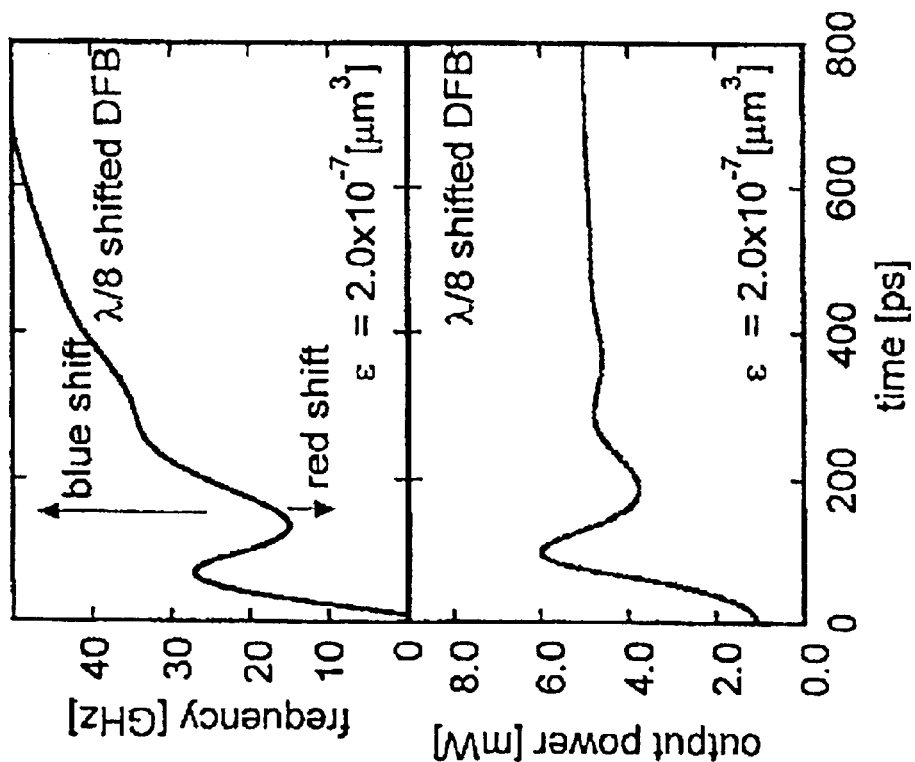

FIGS. 5(a) and 5(b) show calculated frequency variations of semiconductor lasers in view of the above features of the present invention. Specifically, FIG. 5(a) shows the frequency variations and optical intensity of an optical signal produced by the semiconductor laser, which are calculated under the condition for producing the pulse compression effect according to the present invention, and FIG. 5(b) shows the frequency variations and optical intensity of an optical signal produced by a conventional semiconductor laser as a comparative example.

Inventive example: $\kappa L = 3.0$, phase shift $= \lambda/8, \epsilon = 2 \times 10^{-7}$ $\mu m^3$, Conventional example: $\kappa L = 2.0$, phase shift $= \lambda/4, \epsilon = 0$.

While f1–f0 is approximately 10 GHz according to the conventional example, f1–f0 is approximately 40 GHz according to the inventive example. Since f0'–f0 is approximately 20 GHz in the conventional and inventive examples, the pulse compression effect of the inventive structure is achieved.

1st Embodiment

Figure 3:
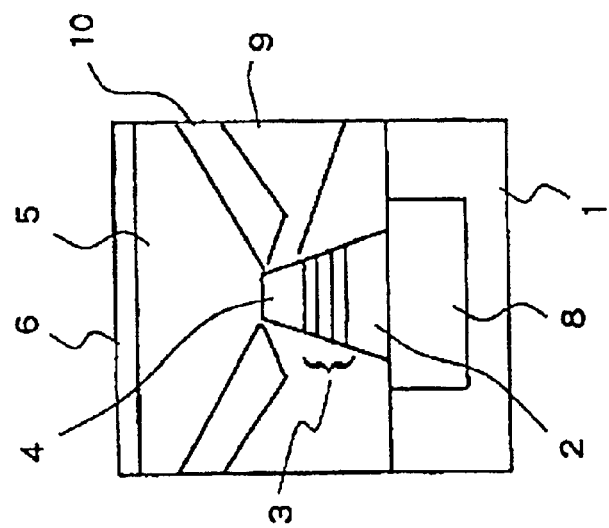
FIG. 3(a) is a cross-sectional view of a DFB semiconductor laser according to a first embodiment of the present invention, the view being taken along the direction in which a laser beam is guided.
FIG. 3(b) is a cross-sectional view of the DFB semiconductor laser according to the first embodiment of the present invention, the view being taken along the direction perpendicular to the direction in which the laser beam is guided.
Figure 3:
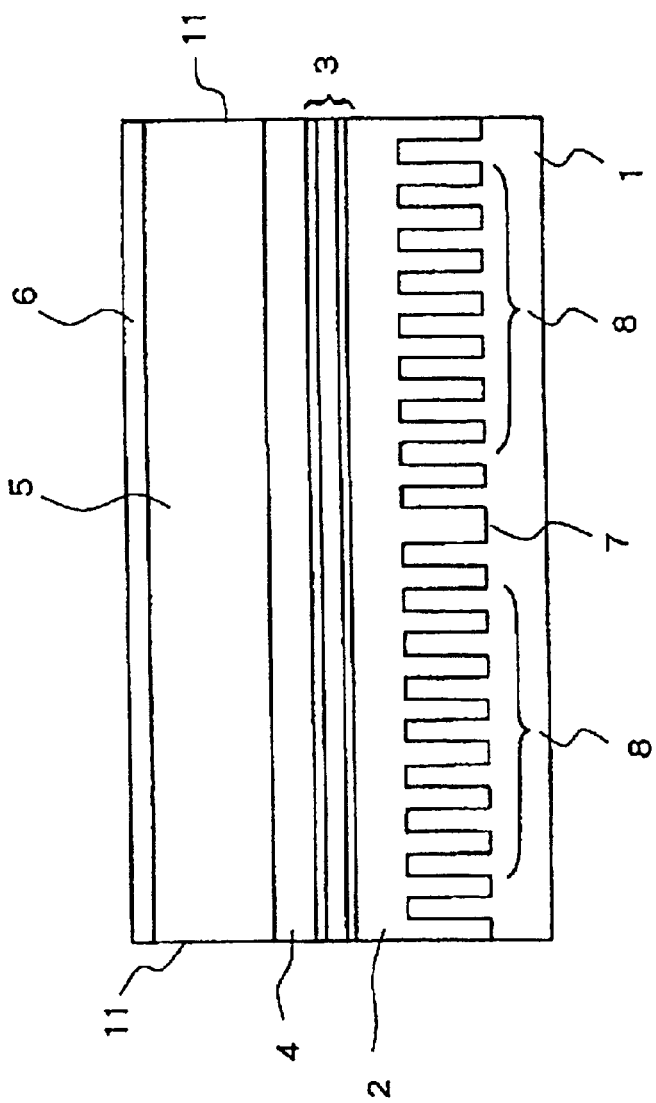
Figure 7:
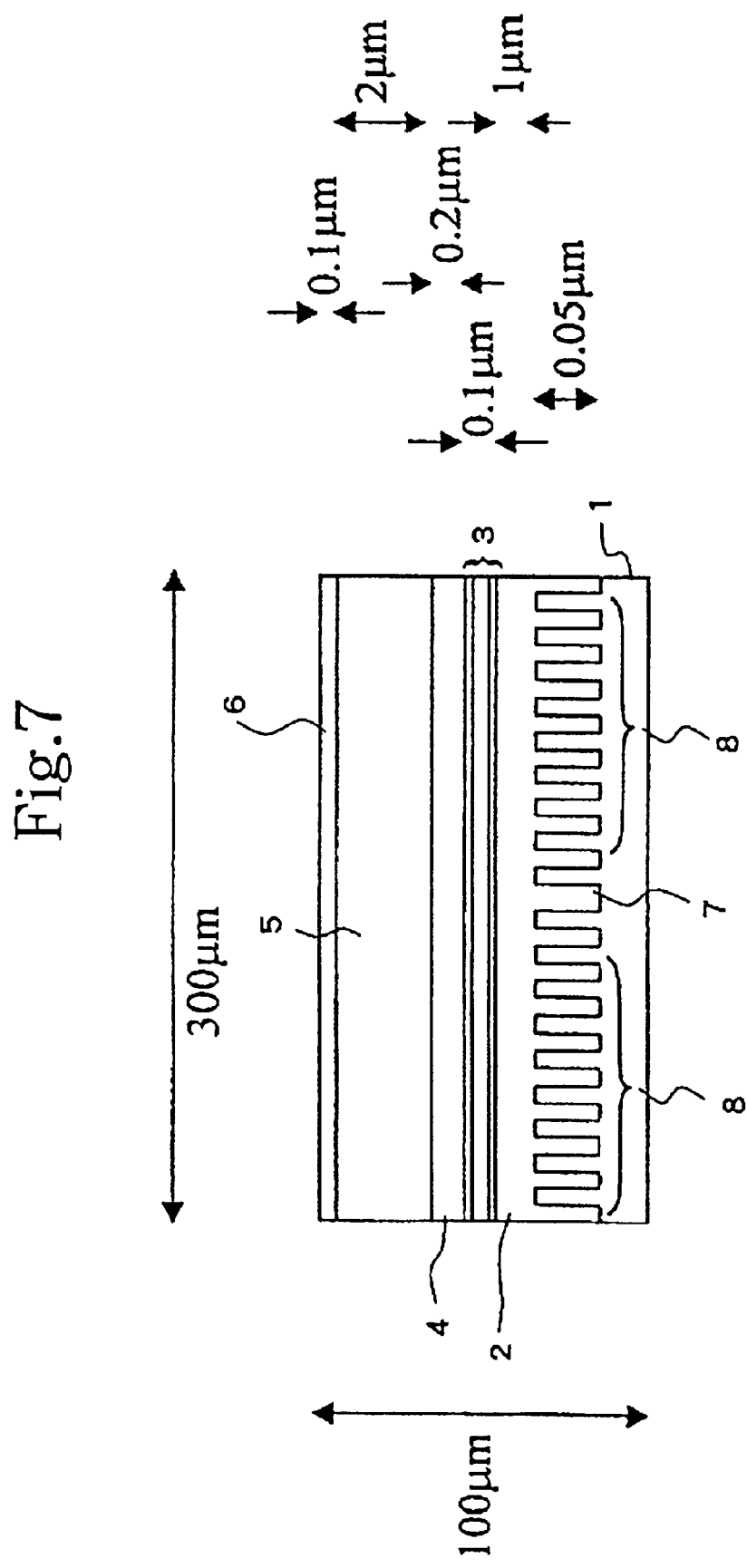
FIG. 7 is a cross-sectional view of the semiconductor laser according to the first embodiment, the view also showing dimensions thereof.

FIGS. 3(a) and 3(b) show in cross section a DFB laser according to a first embodiment of the present invention. FIG. 3(a) shows a cross section of the DFB laser along the direction in which a laser beam is guided, and FIG. 3(b) shows a cross section of the DFB laser along the direction perpendicular to the direction in which a laser beam is guided. FIG. 7 shows in cross section the semiconductor laser, the view also showing dimensions thereof, and FIG. 8 shows a band structure of a multiple quantum well of the semiconductor laser.

The DFB laser according to the present invention includes a resonator having a length of 300 $\mu m$ and a height of 100 $\mu m$. The DFB laser has $n^+$-InP substrate 1, diffraction grating 8 disposed on $n^+$-InP substrate 1 and having a height of 0.05 $\mu m$ and including phase shift region 7, optical guide layer 2 of n-InGaAsP disposed on $n^+$-InP substrate 1 and having a height of 1 $\mu m$, MQW layer 3 of InGaAsP disposed on optical guide layer 2 and having a height of 0.1 $\mu m$, optical guide layer 4 of p-InGaAsP disposed on MQW layer 3 and having a height of 0.2 $\mu m$, cladding layer 5 of p-InP disposed on optical guide layer 4 and having a height of 2 $\mu m$, and cap layer 6 of $p^+$-InGaAsP disposed on cladding layer 5 and having a height of 0.1 $\mu m$. Cladding layer 5 of p-InP includes embedded layers 10 of n-InP for constricting a current to allow the current to flow efficiently in MQW layer 3 of InGaAsP, as shown in FIG. 3(b). MQW layer 3 as an active layer also includes embedded layers 9 of p-InP in its opposite sides.

Figure 8:
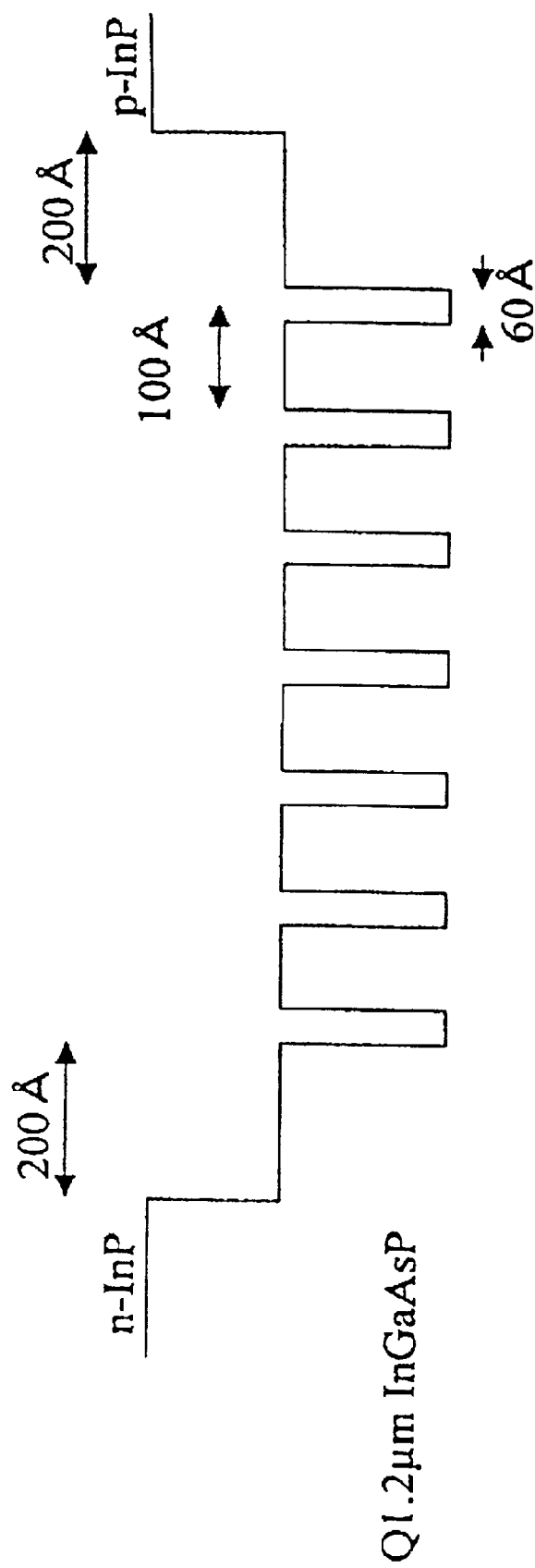
FIG. 8 is a diagram showing a band structure of a multiple quantum well of the semiconductor laser according to the first embodiment.

As shown in FIG. 8, MQW (Multiple Quantum Well) layer 3 comprises alternate layers of InGaAsP having a thickness of 100 Å and a band gap energy of 1.2 $\mu m$ in terms of a wavelength, and InGaAsP having a thickness of 60 Å and a band gap energy of 0.6 $\mu m$ in terms of a wavelength, with a lattice state where an interatomic compressive distortion is 0.7%, and a layer of InGaAsP disposed between optical guide layers 2, 4 and having a thickness of 200 Å and a band gap energy of 1.2 $\mu m$ in terms of a wavelength.

Diffraction grating 8 which serves as the resonator is divided into two regions in the longitudinal direction of the resonator. Phase shift region 7 is disposed between the region divided regions of diffraction grating 8. A phase shift in phase shift region 7 is represented by λ/n (where λ is the wavelength of oscillations and n>4), e.g., λ/8 (n=8).

In the present embodiment, the length of the resonator is represented by L, and the period (pitch) of diffraction grating 8 by Λ. Phase shift region 7 includes a flat surface having a width of λ/n along the longitudinal direction of the resonator. As a result, the distance between peaks of the regions of diffraction grating 8 immediately near phase shift region 7 is represented by (Λ−λ/n). The phase shift is an excessive phase shift that is applied from the diffraction grating to the light.

Phase shift region 7 may not necessarily include a flat surface. Rather, the regions of diffraction grating 8 may be positioned adjacent to each other such that the phase difference (advanced) therebetween is indicated by λ/n.

Low-reflection films 1I are attached respectively to front and rear end faces of the resonator. When a voltage is applied between upper and lower electrodes (not shown) mounted on MQW layer 3 in sandwiching relation thereto, a current is injected into the DFB laser to oscillate the DFB laser.

In the present embodiment, the amplitude of diffraction grating 8 is made greater than the conventional amplitude in order to increase the normalized coupling coefficient κL. Alternatively, the composition of optical guide layer 2 is adjusted to increase the difference between the refractive index thereof and the refractive index of substrate 1 for thereby achieving a normalized coupling coefficient κL in the range of about 2.0 to 3.5.

2nd Embodiment

A semiconductor laser according to second embodiment of the present invention will be described below.

According to the second embodiment, an active layer has a multiple quantum well structure having irregular growth surfaces to cause the gain of the active layer to be saturated as the carrier concentration in the active layer increases. FIGS. 9(a) through 9(j) show successive steps of fabricating the semiconductor laser according to the second embodiment of the present invention.

The semiconductor laser according to the second embodiment is of a structure identical to the semiconductor laser according to the first embodiment shown in FIGS. 3(a), 3(b), 7, and 8.

Figure 9:
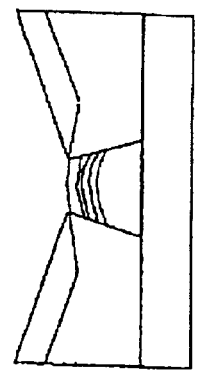
FIGS. 9(a) through 9(j) are cross-sectional views showing successive steps of fabricating a semiconductor laser according to a second embodiment of the present invention.
Figure 9:
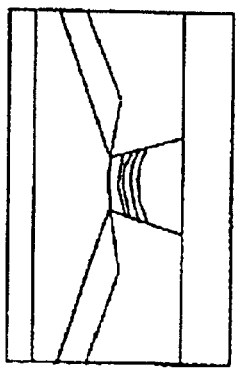
Figure 9:
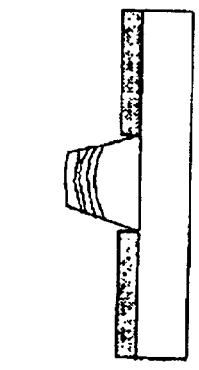
Figure 9:
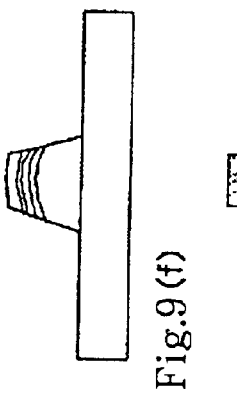
Figure 9:
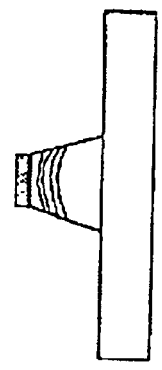
Figure 9:
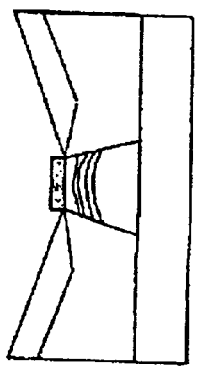
Figure 9:
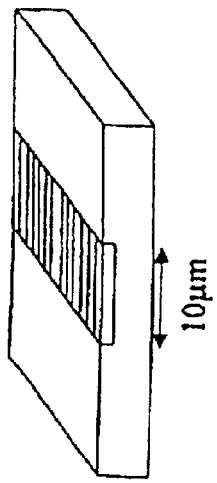
Figure 9:
Figure 9:
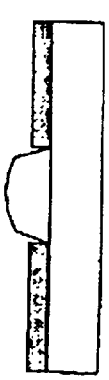
Figure 9:
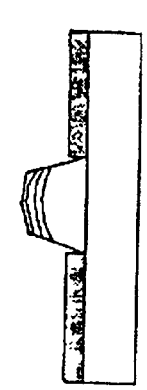

A diffraction grating having a width of 10 μm including a phase shift region is patterned on an n+-InP substrate (FIG. 9(a)), and then SiO₂ is patterned to expose the diffraction grating across a width of 1.5 μm (FIG. 9(b)). Then, an optical guide layer of n-InGaAsP grown at a reactive tube temperature of 655° C. at a partial pressure ratio of 400 between a V group element and a III group element (V–III ratio) is formed on the exposed diffraction grating (FIG. 9(c)). Then, an MQW layer of InGaAsP is grown on the optical guide layer (FIG. 9(d)).

The optical guide layer of n-InGaAsP has an irregular shape as shown. Consequently, the MQW layer subsequently grown on the optical guide layer also has an irregular growth surface. The irregular growth surface has a centrally convex shape in the illustrated embodiment. However, the irregular growth surface may be of any shape insofar as it provides such characteristics that the gain of the active layer (MQW layer) is saturated as the carrier concentration in the active layer increases. For example, the irregular growth surface may be of a centrally concave shape. It is important that the multiple quantum well structure have irregularities on its growth surface, and the multiple quantum well structure is not limited to the illustrated shape.

After an optical guide layer of p-InGaAsP is formed (FIG. 9(e)), SiO₂ on the n+-InP substrate is removed (FIG. 9(f)), and SiO₂ is patterned on the optical guide layer of p-InGaAsP (FIG. 9(g)). Then, an embedded layer of p-InP and an embedded layer of n-InP are successively deposited on the n+-InP substrate (FIG. 9(h)), after which SiO₂ on the optical guide layer of p-InGaAsP is removed (FIG. 9(i)). Then, a cladding layer of p-InP and a cap layer of p+-InGaAsP are successively deposited on the surface formed so far (FIG. 9(j)). In the quantum well structure according to the present embodiment, the maximum layer thickness is about twice the minimum layer thickness.

In the present embodiment, since the MQW layer as the active layer is of the multiple quantum well structure having growth surface irregularities, the gain saturation coefficients is increased, and the gain is saturated as the carrier concentration in the active layer increases, resulting in a pulse compression effect.

3rd Embodiment

A semiconductor laser according to a third embodiment of the present invention will be described below.

Figure 10:
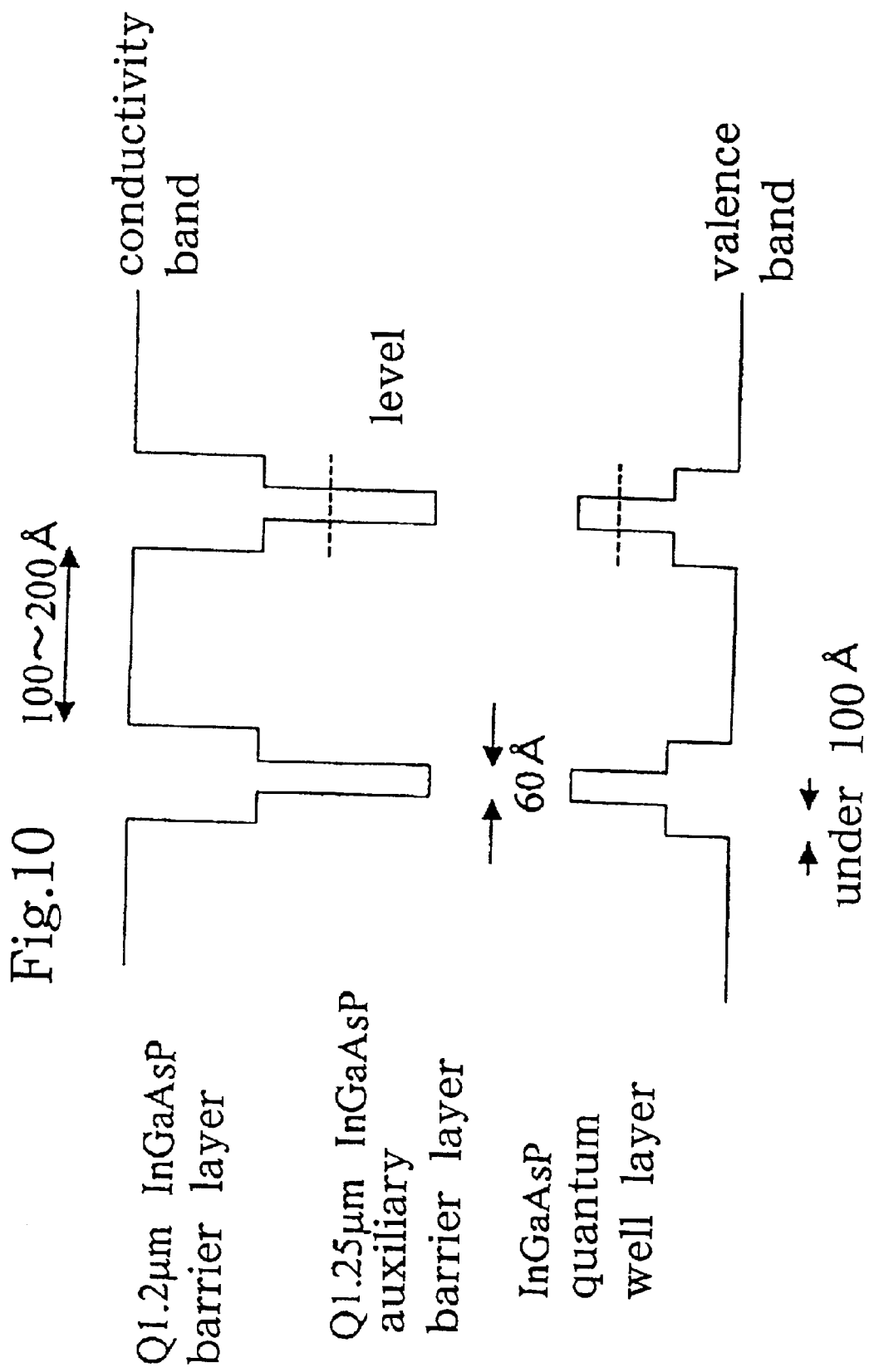
FIG. 10 is a diagram showing a band structure of an active layer of a semiconductor laser according to a third embodiment of the present invention.

The semiconductor laser according to the third embodiment is of a structure which is the same as the semiconductor laser according to the first embodiment except that an active layer is of a multiple quantum well structure composed of two stage potential quantum wells. FIG. 10 shows a band structure of the active layer of the semiconductor laser according to the third embodiment of the present invention.

As sown in FIG. 10, the multiple quantum well structure according to the present embodiment comprises a barrier layer of InGaAsP having a band energy of 1.2 μm in terms of a wavelength, an auxiliary barrier layer of InGaAsP having a band energy of 1.25 μm in terms of a wavelength, and a quantum well layer of InGaAsP. With this band structure, the number of electrons utilized for light emission is small, the gain saturation coefficient increases, and the gain is saturated as the carrier concentration in the active layer increases, resulting in a pulse compression effect.

4th Embodiment

A semiconductor laser according to a fourth embodiment of the present invention will be described below.

Figure 11:
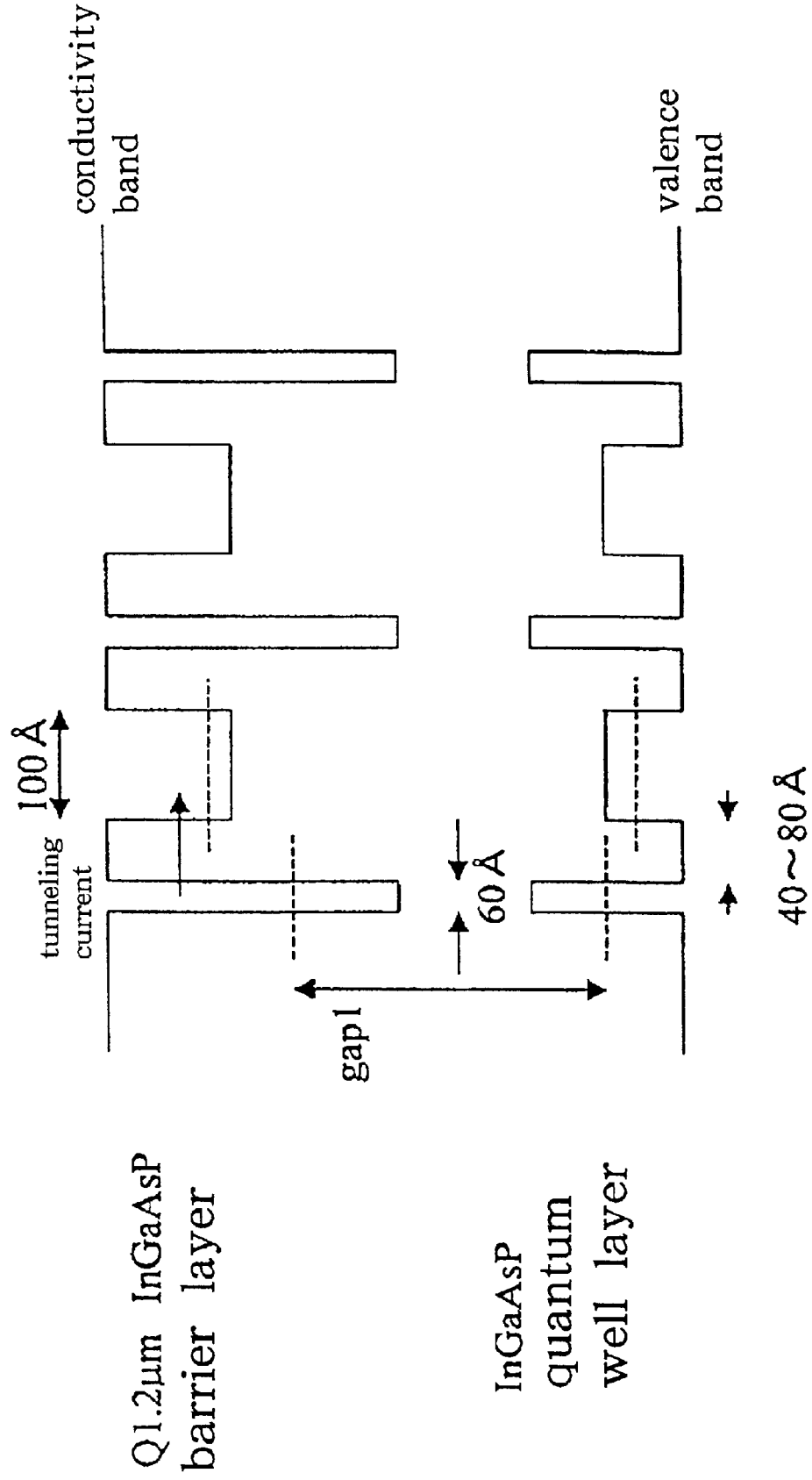
FIG. 11 is a diagram showing a band structure of an active layer of a semiconductor laser according to a fourth embodiment of the present invention.

The semiconductor laser according to the fourth embodiment is of a structure which is the same as the semiconductor laser according to the first embodiment except that an active layer is of a multiple quantum well structure including a non-radiative carrier recombination layer. FIG. 11 shows a band structure of the active layer of the semiconductor laser according to the fourth embodiment of the present invention.

As shown in FIG. 11, the multiple quantum well structure according to the present embodiment comprises barrier layers of InGaAsP having thicknesses of 60 Å and 100 Å and a band energy of 1.2 μm in terms of a wavelength, and a quantum well layer of InGaAsP interposed between the barrier layers. The barrier layer of InGaAsP having a thickness of 100 Å serves as a non-radiative carrier recombination layer. Electrons are stored in the quantum well of InGaAsP having a thickness of 60 Å, and thereafter moved as a tunnel current into the quantum well of InGasP having the thickness of 100 Å. The electrons that have been moved into the quantum well of InGaAsP having the thickness of 100 Å do not contribute to light emission. Therefore, the number of electrons that are utilized for light emission is small, the gain saturation coefficient ε increases, and the gain is saturated as the carrier concentration in the active layer increases, resulting in a pulse compression effect.

5th Embodiment

Figure 12:
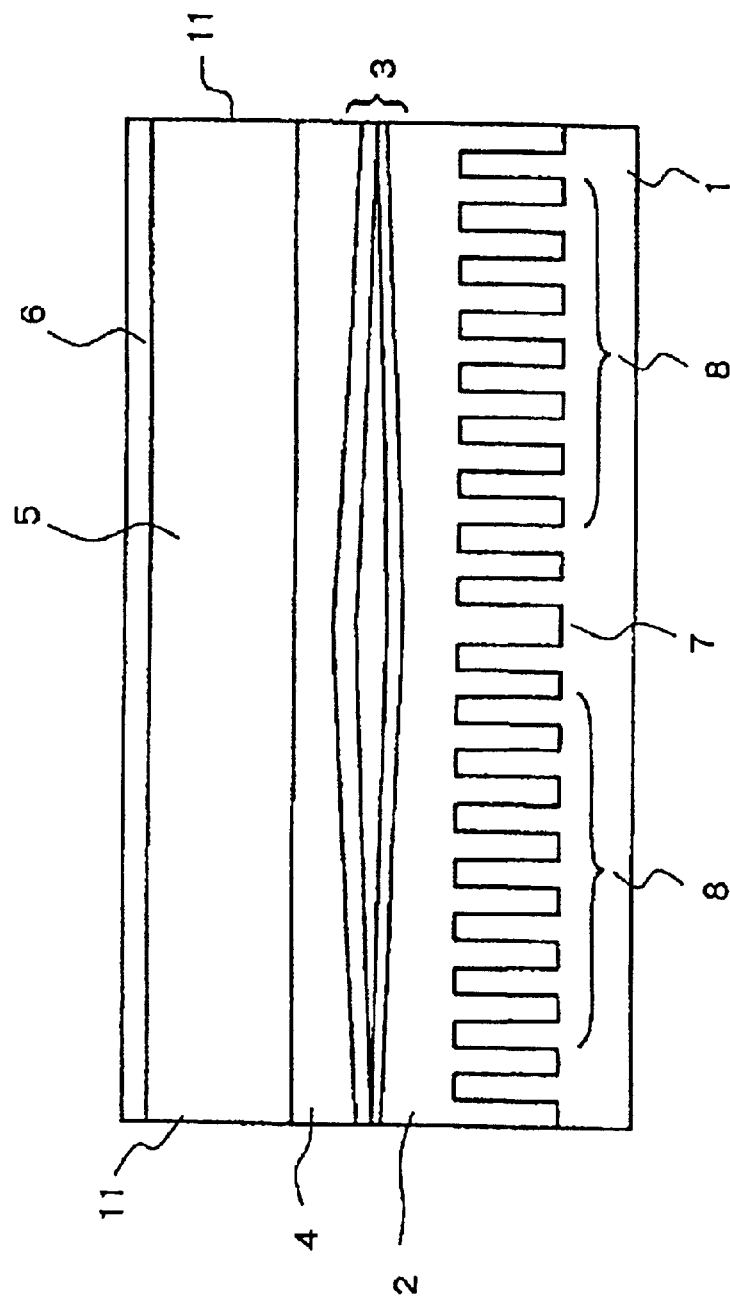
FIG. 12 is a cross-sectional view of a semiconductor laser according to a fifth embodiment of the present invention.

A semiconductor laser according to a fifth embodiment of the present invention will be described below. FIG. 12 shows in cross section a structure of the semiconductor laser according to the fifth embodiment.

The semiconductor laser according to the fifth embodiment is of a structure which is the same as the semiconductor laser according to the first embodiment except that an active layer is of a multiple quantum well structure which is progressively thicker toward the center of the semiconductor laser in the axial direction of the resonator.

In the fifth embodiment, the distance between multiple quantum wells varies depending on the position in the longitudinal direction of the resonator. Consequently, the number of electrons that are utilized for light emission is small, the gain saturation coefficient ε substantially increases, and the gain is saturated as the carrier concentration in the active layer increases, resulting in a pulse compression effect.

The thickness of the central region of active layer is about 20 percent greater than the thickness of the active layer at its end faces to provide the same advantages as those of the second embodiment in which the maximum layer thickness is about twice the minimum layer thickness.

6th Embodiment

A sixth embodiment of the present invention will be described below.

The sixth embodiment of the present invention is concerned with a digital optical communication system which uses a semiconductor laser according to each of the above embodiments as an electro-optical transducer in the digital optical communication system. Other structural details of the sixth embodiment of the present invention are the same as those of the conventional arrangement shown in FIG. 1 and will not be described below.

Since the semiconductor laser according to each of the above embodiments is used as an electro-optical transducer, the frequency of oscillations of the optical signal intensity due to relaxation oscillation after the optical signal has been transmitted through the optical fiber is increased. After an electric signal converted from the optical signal has passed through a low-pass filter, the relaxation oscillation is removed, and the signal restores its original waveform, resulting in a power penalty that is smaller than the power penalty in the conventional arrangement. For example, the power penalty after a directly modulated signal of 2.5 Gb/s has been transmitted over a distance of 100 km is reduced to 1 decibel or less.

The present invention offers the following advantages:

A semiconductor laser which tends to saturate the gain is used, and an electro-optical transduction is performed for pulse compression, for thereby reducing a power penalty upon the transmission of an optical signal over a long distance through an optical fiber.

While preferred embodiments of the present invention have been described using specific terms, such description is for illustrative purposes only, and it is to be understood that changes and variations may be made without departing from the spirit or scope of the following claims.

What is claimed is:

1. A semiconductor laser that modulates from a first level to a second level, comprising:
   a diffraction grating for effecting distribution feedback, said diffraction grating having a normalized coupling coefficient κL of at least 2.0, said diffraction grating having a phase shift region disposed therein for achieving a phase shift of at most λ/4; and
   an active layer including a multiple quantum well structure, having a gain saturation coefficient of greater than 0, such that said gain is saturated as a carrier concentration in the active layer increases.

2. A semiconductor laser according to claim 1, further comprising a resonator, said phase shift region being disposed nearly centrally in said resonator.

3. A digital optical communication system comprising a semiconductor laser according to claim 2 as a communication light source.

4. A digital optical communication system comprising a semiconductor laser according to claim 1 as a communication light source.

5. A semiconductor laser, comprising:
   a diffraction grating for effecting distribution feedback, said diffraction grating having a normalized coupling coefficient κL of at least 2.0, said diffraction grating having a phase shift region disposed therein for achieving a phase shift of at most λ/4; and
   an active layer including a gain, which is saturated as a carrier concentration in the active layer increases,
   wherein said active layer includes a multiple quantum well structure having growth surface irregularities.

6. A semiconductor laser, comprising:
   a diffraction grating for effecting distribution feedback, said diffraction grating having a normalized coupling coefficient λL of at least 2.0, said diffraction grating having a phase shift region disposed therein for achieving a phase shift of at most λ/4;
   an active layer including a gain, which is saturated as a carrier concentration in the active layer increases; and
   a resonator, said phase shift region being disposed nearly centrally in said resonator,
   wherein said active layer includes a multiple quantum well structure having growth surface irregularities.

7. A semiconductor laser, comprising:
   a diffraction grating for effecting distribution feedback, said diffraction grating having a normalized coupling coefficient κL of at least 2.0, said diffraction grating having a phase shift region disposed therein for achieving a phase shift of at most λ/4; and
   an active layer including a gain, which is saturated as a carrier concentration in the active layer increases,
   wherein said active layer includes a multiple quantum well structure comprising two stage potential quantum wells.

8. A semiconductor laser, comprising:
   a diffraction grating for effecting distribution feedback, said diffraction grating having a normalized coupling coefficient κL of at least 2.0, said diffraction grating having a phase shift region disposed therein for achieving a phase shift of at most λ/4;
   an active layer including a gain, which is saturated as a carrier concentration in the active layer increases; and
   a resonator, said phase shift region being disposed nearly centrally in said resonator,
   wherein said active layer includes a multiple quantum well structure comprising two stage potential quantum wells.

9. A semiconductor laser, comprising:

a diffraction grating for effecting distribution feedback, said diffraction grating having a normalized coupling coefficient $\lambda L$ of at least 2.0, said diffraction grating having a phase shift region disposed therein for achieving a phase shift of at most $\lambda/4$; and an active layer including a gain, which is saturated as a carrier concentration in the active layer increases,
wherein said active layer includes a multiple quantum well structure including a non-radiative carrier recombination layer.

10. A semiconductor laser, comprising:

a diffraction grating for effecting distribution feedback, said diffraction grating having a normalized coupling coefficient $\kappa L$ of at least 2.0, said diffraction grating having a phase shift region disposed therein for achieving a phase shift of at most $\lambda/4$;

an active layer including a gain, which is saturated as a carrier concentration in the active layer increases; and a resonator, said phase shift region being disposed nearly centrally in said resonator,
wherein said active layer includes a multiple quantum well structure including a non-radiative carrier recombination layer.

11. A semiconductor laser, comprising:

a diffraction grating for effecting distribution feedback, said diffraction grating having a normalized coupling coefficient $\kappa L$ of at least 2.0, said diffraction grating having a phase shift region disposed therein for achieving a phase shift of at most $\lambda/4$; and an active layer including a gain, which is saturated as a carrier concentration in the active layer increases,
wherein said active layer includes a multiple quantum well structure which is progressively thicker toward the center of the semiconductor laser in the axial direction of the resonator.

12. A semiconductor laser, comprising:

a diffraction grating for effecting distribution feedback, said diffraction grating having a normalized coupling coefficient $\kappa L$ of at least 2.0, said diffraction grating having a phase shift region disposed therein for achieving a phase shift of at most $\lambda/4$;

an active layer including a gain, which is saturated as a carrier concentration in the active layer increases; and a resonator, said phase shift region being disposed nearly centrally in said resonator,
wherein said active layer includes a multiple quantum well structure which is progressively thicker toward the center of the semiconductor laser in the axial direction of the resonator.

* * * * *